US006577211B1

(12) United States Patent
Tsujiguchi

(10) Patent No.: US 6,577,211 B1
(45) Date of Patent: Jun. 10, 2003

(54) TRANSMISSION LINE, FILTER, DUPLEXER AND COMMUNICATION DEVICE

(75) Inventor: Tatsuya Tsujiguchi, Kanazawa (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/614,741

(22) Filed: Jul. 12, 2000

(30) Foreign Application Priority Data

Jul. 13, 1999 (JP) .......................................... 11-199237

(51) Int. Cl.[7] ............................ H01P 3/08; H01P 5/12; H03H 7/38

(52) U.S. Cl. ....................... 333/204; 333/238; 333/246; 333/33; 333/134

(58) Field of Search ................................ 333/238, 246, 333/33, 204, 134

(56) References Cited

U.S. PATENT DOCUMENTS 4,855,537 A * 8/1989 Nakai et al. ............... 174/68.5
5,479,138 A * 12/1995 Kuroda et al. ................. 333/1
5,818,315 A * 10/1998 Moongilan .................. 333/238
6,023,209 A * 2/2000 Faulkner et al. ............ 333/238
6,144,268 A * 11/2000 Matsui et al. ............... 333/134

FOREIGN PATENT DOCUMENTS

JP 62-133401 8/1987
JP 08-303268 11/1996

OTHER PUBLICATIONS

Japanese Office Action dated Aug. 13, 2002 with English Translation.
Radisic, Vesna, et al., "Novel 2–D Photonic Bandgap Structure for Microstrip Lines," IEEE Microwave and Guided Wave Letters, vol. 8, No. 2, 1998.

* cited by examiner

*Primary Examiner*—Patricia Nguyen
(74) *Attorney, Agent, or Firm*—Dickstein, Shapiro, Morin & Oshinsky, LLP.

(57) ABSTRACT

A conductor line is formed on the upper side of a dielectric plate, and a ground electrode is formed on the underside. Further, electrode non-formation portions are distributed at intervals a in the propagation direction of a signal and at intervals b in the perpendicular direction to the propagation direction. A band-stop or low-pass filter characteristic is produced by increasing the transmission loss in a frequency band determined by the intervals a, and the attenuation in the stop-band is determined by the intervals b in the width direction.

20 Claims, 17 Drawing Sheets

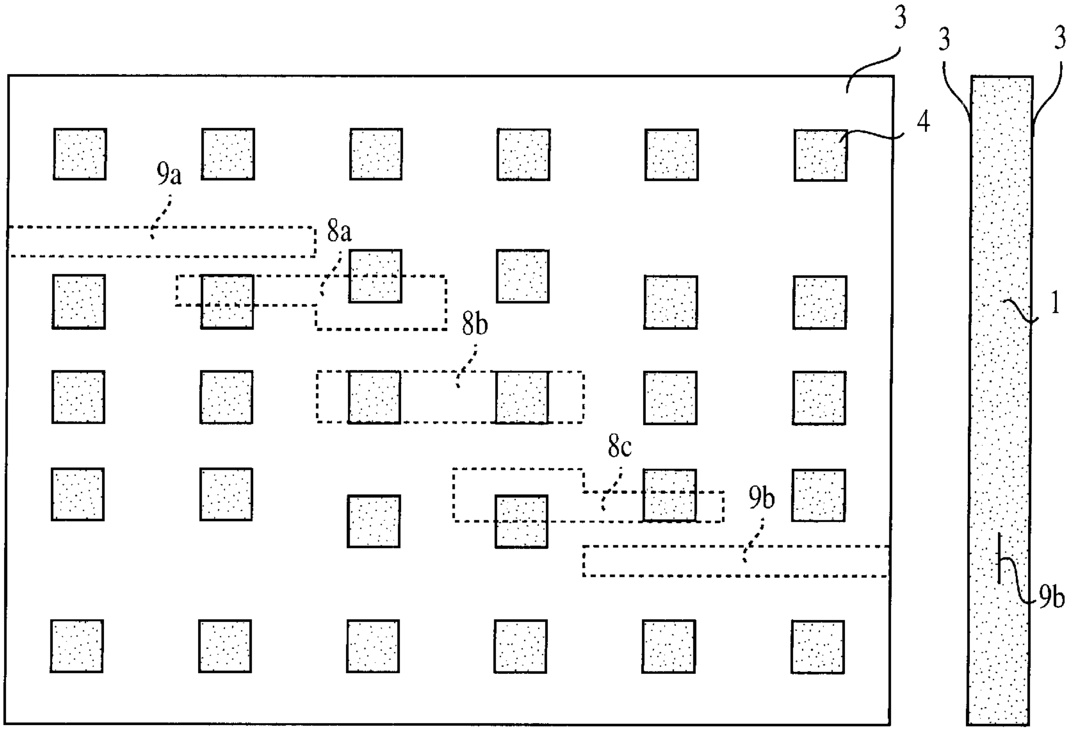
FIG. 15A
FIG. 15C
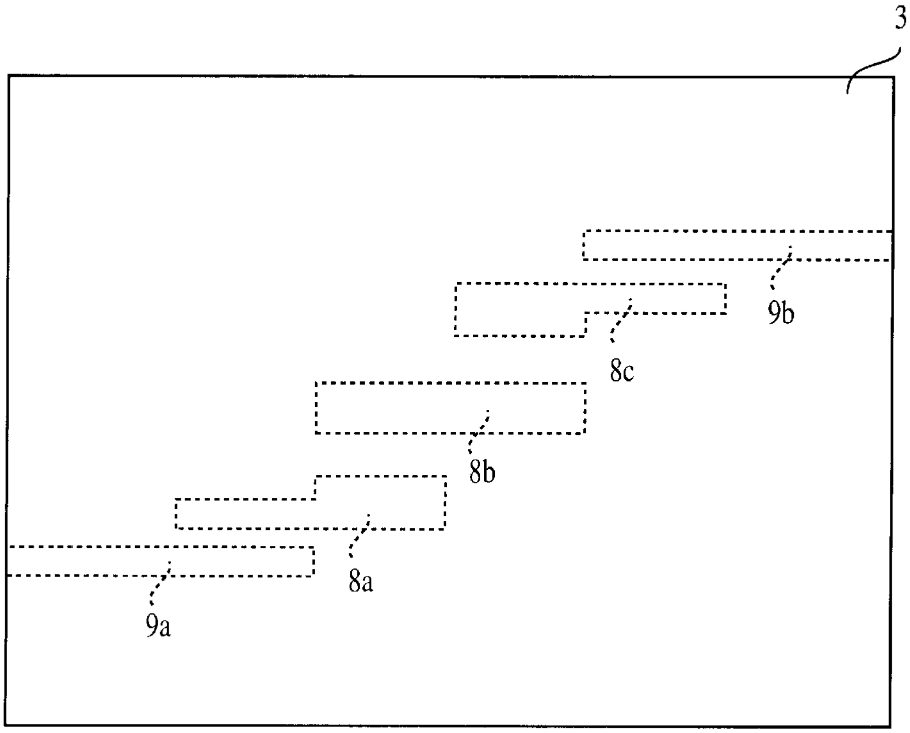
FIG. 15B

TRANSMISSION LINE, FILTER, DUPLEXER AND COMMUNICATION DEVICE

BACKGROUND OF THE INVENTION

1. Field of the Invention

The present invention relates to a transmission line, a filter, a duplexer, each being for use in a microwave band, and a communication device including them.

2. Description of the Related Art

It has been known that by periodically changing the line impedance of a transmission line in the transmission direction of a signal, a frequency characteristic intrinsic to the transmission line can be presented, as descried in Vesna Radisic etc, "Novel 2-D Photonic Bandgap Structure for Microstrip Lines", IEEE MICROWAVE AND GUIDED WAVE LETTERS, Vol. 8, No. 2, FEBRUARY 1998 (Literature 1), Fei-Ran Yang etc, "A Novel Compact Microstrip Bandpass Filter with Intrinsic Spurious Suppression", Asia-Pacific Microwave Conference Digest December 1998 (Literature 2). The Literatures 1 and 2 show that electrode-removed portions are arranged in the earth surface of a microstrip line at equal periods in the signal propagation direction and in the perpendicular direction to the signal propagation direction.

However, in the case of designing a filter by use of such a transmission line of which the impedance is periodically changed, it is difficult to design a filter having a predetermined filter-characteristic by connecting the transmission lines to each other, since the shape of the signal propagation line portion becomes complicated.

A low-pass characteristic can be rendered to a transmission line such as a microstrip line by forming an electrode-removed pattern in the earth surface thereof. However, the literatures 1 and 2 describe that the electrode-removed patterns are arranged at equal intervals in the signal-propagation direction and in the perpendicular direction thereto. Accordingly, the frequency of the stop-band can not be optionally determined. For example, if the intervals between the above-described electrode-removed patterns are changed in order to change the frequency of the stop-band, the characteristic impedance of the transmission line is changed, and the reflection characteristic is deteriorated, problematically causing the transmission loss to increase.

SUMMARY OF THE INVENTION

To overcome the above described problems, that is, the deterioration of the reflection characteristic and the increase of the transmission loss, preferred embodiments of the present invention provide a transmission line, a filter, a duplexer, each having a desired frequency characteristic, and a communication device including them.

One preferred embodiment of the present invention provides a transmission line comprising: a signal propagation line portion; and a ground electrode in correspondence to the signal propagation line portion, the ground electrode defining a ground electrode formation surface; wherein the electrode non-formation portions are formed in the ground electrode formation surface so as to be distributed at substantially equal intervals in a signal propagation direction and at intervals in the perpendicular direction to the signal propagation direction, at least one of the intervals in the perpendicular direction being different from the intervals in the signal propagation direction.

According to the above arrangement, the electrode non-formation portions are arranged at substantially equal intervals in the signal propagation direction. Thus, a frequency in correspondence to the intervals and the wavelength on the transmission line can be determined as the center frequency in the stop-band. The impedance of the transmission line and the attenuation in the stop-band can be determined by setting the intervals of the electrode non-formation portions in the perpendicular direction to the signal propagation direction, independently of the intervals in the signal propagation direction.

Preferably, the intervals of the electrode non-formation portions substantially in the perpendicular direction to the signal propagation direction are changed in correspondence to the line impedance of the signal propagation line. For example, the impedance matching is carried out on the way of the transmission line. Reversely, the impedance is changed on the way of the transmission line.

Further, according to the present invention, there is provided a filter which comprises the above-described transmission line. That is, the band-stop characteristic of the transmission line itself is used as a filter-characteristic.

Preferably, in the filter of the present invention, the above-described transmission lines are provided as plural resonance lines, adjacent resonance lines thereof being coupled to each other. Accordingly, the filter has both of the band-stop characteristic caused by the above-described electrode non-formation portions and the frequency characteristic caused by the resonance lines.

Another preferred embodiment of the present invention provides a duplexer which comprises two sets of the above-described filters. For example, the above filters are provided as a transmission filter and a reception filter to constitute an antenna sharing device.

Yet another preferred embodiment of the present invention provides a communication device in which the above-described transmission line, filter or duplexer is used.

BRIEF DESCRIPTION OF THE DRAWINGS

FIGS. 15A, 15B, and 15C illustrate an example of the configuration of a filer comprising strip lines;

DESCRIPTION OF THE PREFERRED EMBODIMENT

The configuration of a transmission line according to a first embodiment of the present invention will be described with reference to FIGS. 1A, 1B, and 2.

Figure 1A:
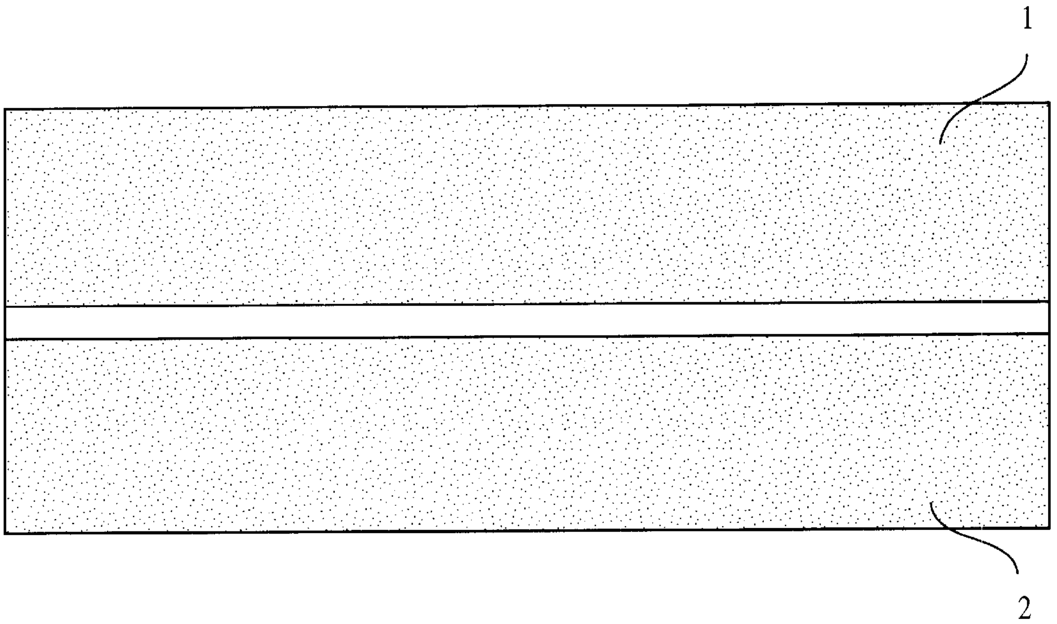
FIGS. 1A and 1B illustrate the structure of a transmission line comprising a microstrip line.
Figure 1B:
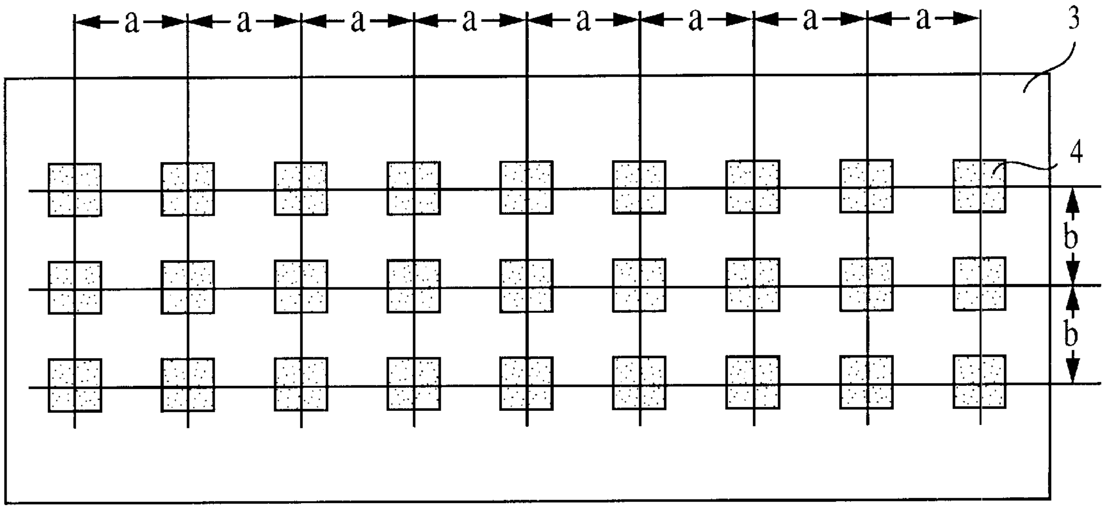

FIG. 1A is a plan view showing a transmission line formed on a dielectric plate. FIG. 1B is a bottom view thereof. In the figures, a conductor line 2 is formed on the upper side of a dielectric plate 1. A ground electrode 3 is formed substantially wholly on the underside of the dielectric plate 1. Further, electrode non-formation portions 4 are periodically distributed therein at intervals a in the propagation direction of a signal (hereinafter, referred to as propagation direction briefly) which is propagated on the conductor line 2 and at intervals b in the perpendicular direction to the propagation direction (hereinafter, referred to as width direction briefly).

A microstrip line is formed by the conductor line 2 on the upper side of the dielectric plate 1 and the ground electrode 3 on the underside thereof. An attenuation region is produced in the band-pass characteristic, caused by the intervals a in the propagation direction of the electrode non-formation portions 4 and the wavelength on the transmission line determined by the dielectric constant of the dielectric plate 1. Further, the attenuation in the stop-band is determined by the intervals b in the width direction.

Figure 2A:
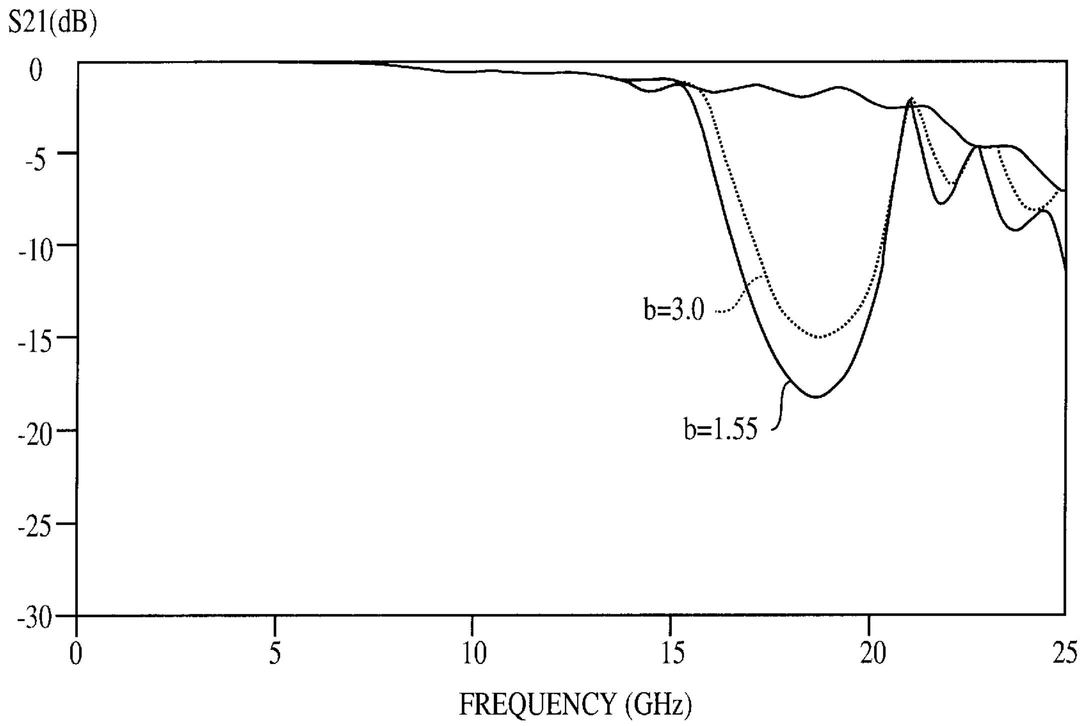
FIG. 2 consists of graphs showing the frequency characteristics of the above transmission line.
Figure 2B:
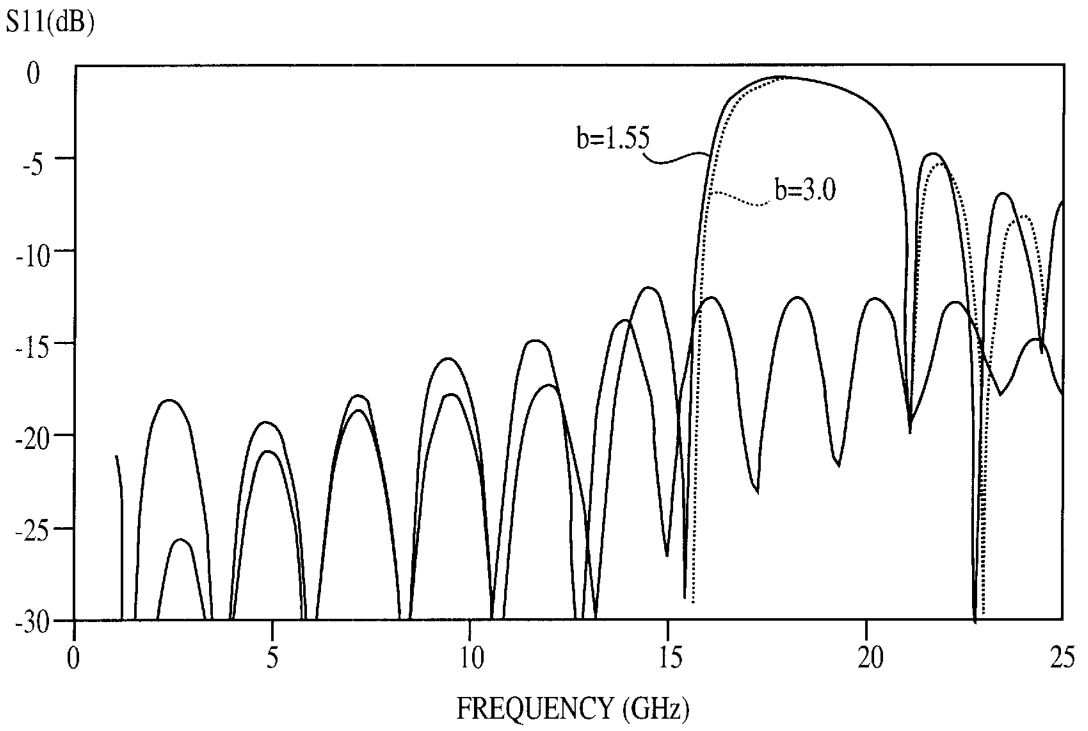

FIG. 2 graphs the frequency characteristic of the above-described transmission line. In this case, the dielectric plate 1 is a dielectric ceramic substrate with a relative dielectric constant of 10.3 and a thickness of 0.635 mm, the conductor line 2 has a size of 25.4 mm long and 0.61 mm wide, and the electrode non-formation portions 4 each have a size of 1.5×1.5 mm and are provided in an arrangement of 3 rows×9 columns with the intervals a in the propagation direction of 3.0 mm. The intervals b in the width direction are set at 3.0 mm or 1.55 mm. As seen in FIG. 2, when the ground electrode is provided on the whole surface without the electrode non-formation portions 4 being formed, no attenuation region is produced in the S21 characteristic. On the other hand, in this example, an attenuation region is produced in the range of 15 to 21 GHz, due to the presence of the electrode non-formation portions 4. That is, a low-pass characteristic having a cut-off frequency of about 15 GHz is presented. As seen in the S21 and S11 characteristics, the attenuation in the attenuation region is increased by reducing the intervals b in the width direction of the electrode non-formation portions. That is, it is understood that the attenuation can be changed by using the intervals b, independently of the stop-band frequency.

The relation between the intervals a in the propagation direction and the center frequency f of the stop-band is expressed by the following equation.

$$f=Vc/\{2\cdot\sqrt{(\epsilon reff)}\cdot a\}$$

in which Vc represents a light velocity, and $\sqrt{(\epsilon reff)}$ represents an effective dielectric constant.

With this configuration, the transmission loss is increased in the frequency band which is determined by the intervals a in the longitudinal direction of the electrode non-formation portions 4. By setting the intervals a in such a manner that the stop-band is produced on the higher frequency side of the frequency band of a signal to be propagated on the transmission line, the propagation mode of higher frequencies than the signal to be transmitted is stopped.

Figure 3A:
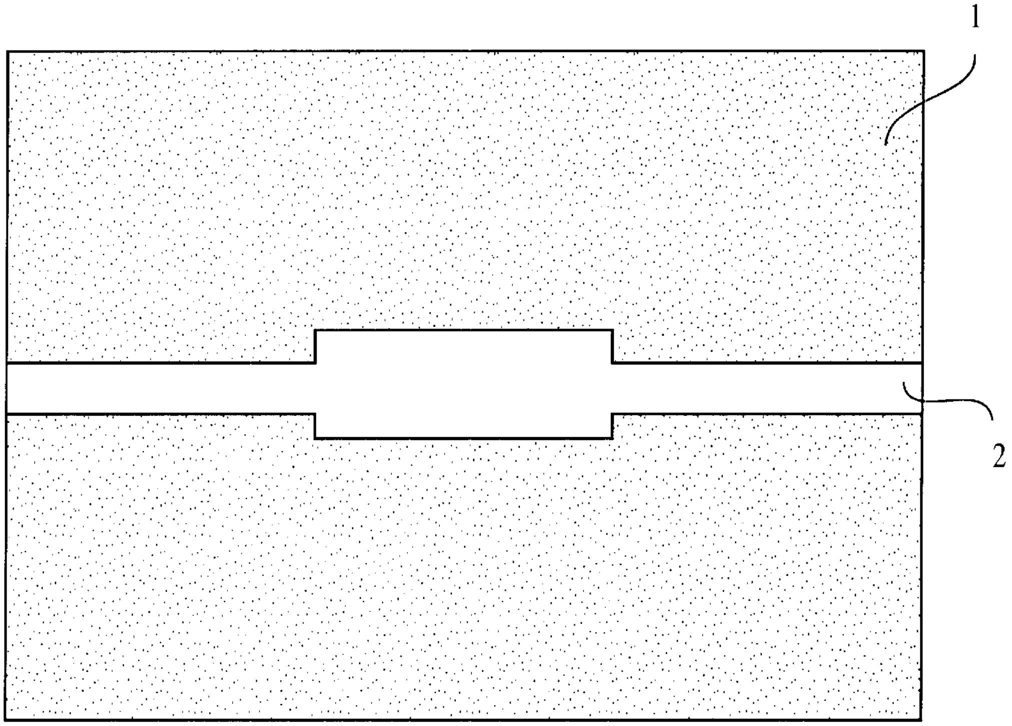
FIGS. 3A and 3B illustrate the structure of a transmission line comprising another microstrip line.
Figure 3B:
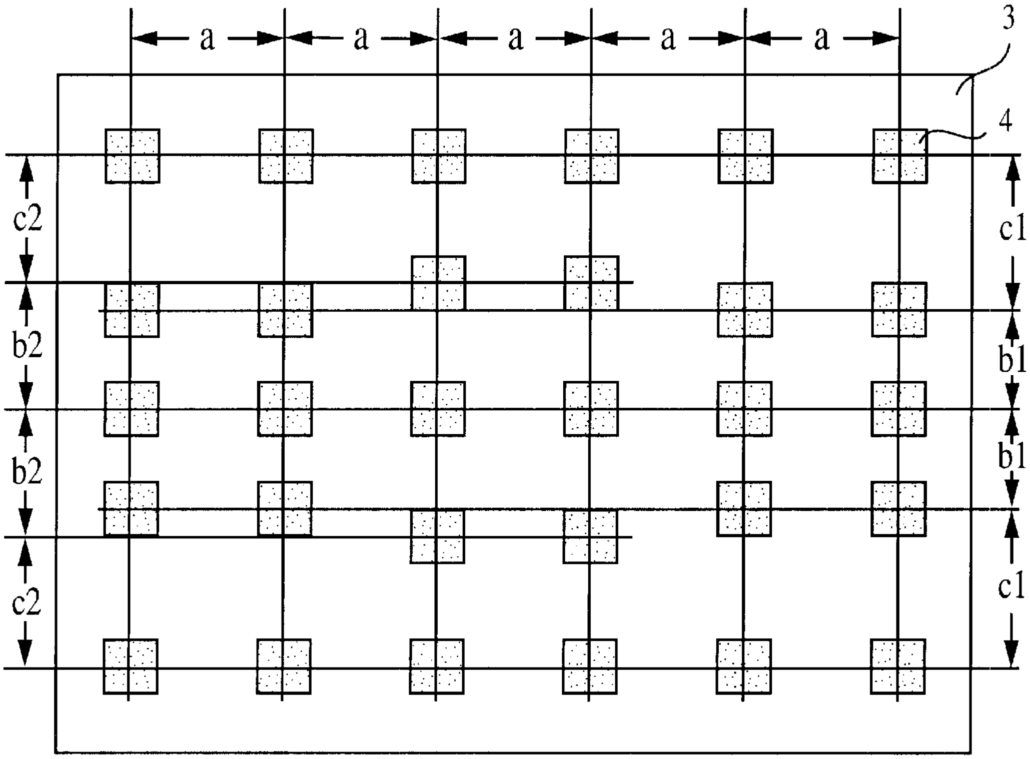

Next, the configuration of a transmission line according to a second embodiment of the present invention will be described with reference to FIGS. 3A and 3B. FIG. 3A is a plan view of a dielectric plate having a transmission line formed thereon. FIG. 3B is a bottom view thereof (the reference characters A and B designate plan and bottom views, respectively, in the figures shown below). A conductor line 2 is formed on the upper side of a dielectric plate 1. A ground electrode 3 is formed on the underside of the substrate 1. In this example, five rows of electrode non-formation portions 4 are provided in the perpendicular direction to the propagation direction, differently from the transmission line shown in FIG. 1. Moreover, the conductor width of the conductor line 2 is changed on its way so as to have a step-like shape. In correspondence to this change in width of the conductor line, the intervals in width direction of the electrode non-formation portions are changed. That is, as compared with the intervals b1 in the width direction, in the area opposed to the thin conductor width portion of the conductor line 2, the electrode non-formation portions, the intervals b2 in the width direction of the electrode non-formation portions 4, in the area opposed to the thin conductor width portion of the conductor line 2 is relatively wide. In the area of the electrode non-formation portions which departs from the opposed area of the conductor liner the electrode non-formation portions 4 are arranged in a straight-line pattern along the propagation direction. Accordingly, the intervals c1 in width direction of the electrode non-formation portions 4 opposed to the narrow width portion of the conductor line and departing from the center thereof are wider than the intervals c2 in wide width of the electrode non-formation portions 4 opposed to the wide conductor width portion of the conductor line. Regarding the distribution of electromagnetic fields generated between the line conductor 2 and the ground electrode 3, the electromagnetic fields are concentrated onto and near to the conductor line 2. Therefore, the line impedance is affected by the intervals b1 and b2 in width direction of the electrode non-formation portions 4 in the area thereof near to the conductor line 2.

In general, in a microstrip line having a ground electrode applied on a whole surface, with the conductor width of the conductor line being increased, the capacitance component of the distribution constant becomes higher. As described in this embodiment, the capacitance component can be further increased by widening the intervals in width direction of the electrode non-formation portions 4 correspondingly to the wide conductor width portion of the conductor line. Thus, the difference between the impedances in the step structure can be further increased.

Figure 4:
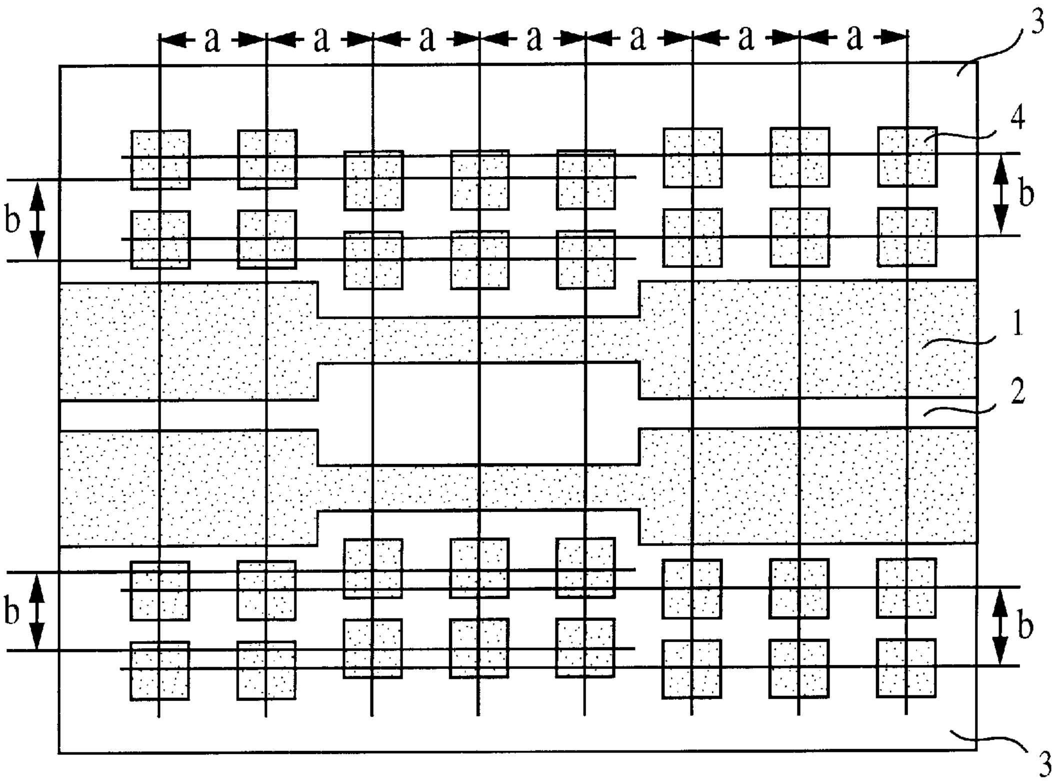
FIG. 4 illustrates the configuration of a transmission line comprising a coplanar line.

FIG. 4 is a plan view of a transmission line according to a third embodiment of the present invention. As shown in FIG. 4, a coplanar line is formed by arranging a conductor line 2 and ground electrodes 3 on the upper side of a dielectric plate 1 in such a manner that the ground electrodes 3 are on the opposite sides of the conductor line 2. No especial electrode is formed on the underside of a dielectric plate 1. In the ground electrode 3, plural electrode non-formation portions 4 are distributed at intervals a in the propagation direction and intervals b in the width direction. With this configuration, the transmission loss in the frequency band determined by the intervals a in the longitudinal direction of the electrode non-formation portions 4 is increased. By setting the intervals a in such a manner that a stop-band is produced on the higher frequency side of the frequency band of a signal to be propagated on the transmission line, a low-pass characteristic is rendered on the higher frequency side of the pass-band.

Further, a grounded coplanar line can be formed by forming the same electrode pattern as in FIG. 4 on the upper side of the dielectric plate 1, and providing a ground electrode wholly on the underside of the dielectric plate 1.

Figure 5A:
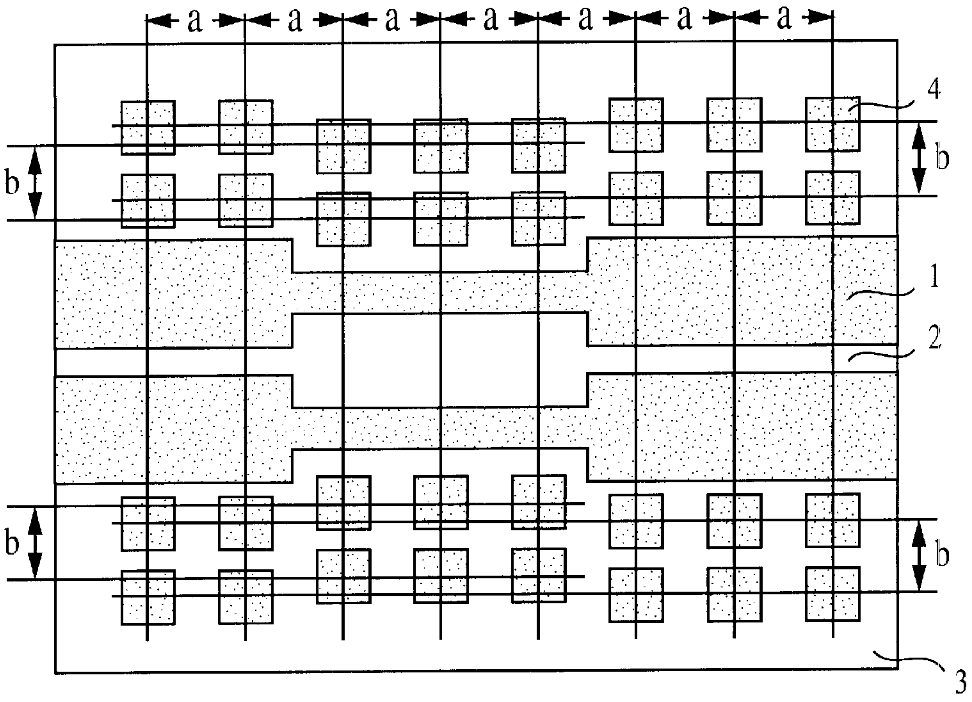
FIGS. 5A and 5B illustrate the configuration of a transmission line comprising a grounded coplanar line.
Figure 5B:
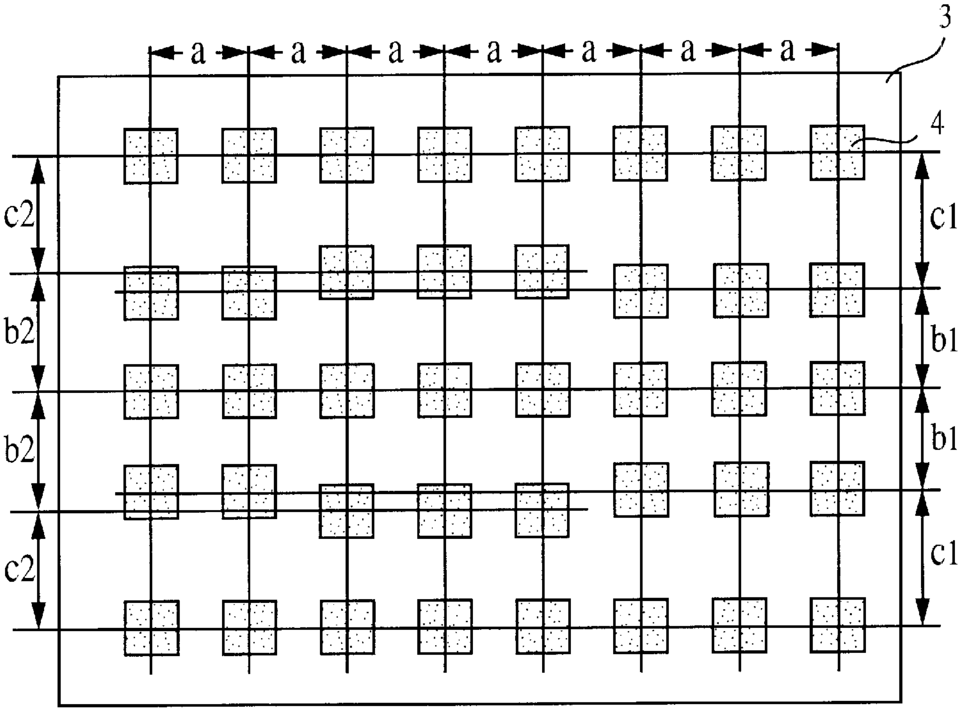

FIGS. 5A and 5B show an example of a grounded coplanar line. On the underside of the dielectric plate, electrode non-formation portions 4 are formed so as to be distributed in the propagation direction and in the width direction. In this example, the intervals b2 in width direction of the electrode non-formation portions 4 opposed to the wide conductor width portion of a conductor line 2 are wider than the intervals b1 in width direction of the electrode non-formation portions 4 opposed to the narrow conductor width portion of the conductor line 2. For this reason, the capacitance component produced between the conductor line 2 and the ground electrode 3 is relatively large in the wide conductor width portion of the conductor line 2. With this configuration, the difference between the line impedances in the step structure is further increased.

Figure 6:
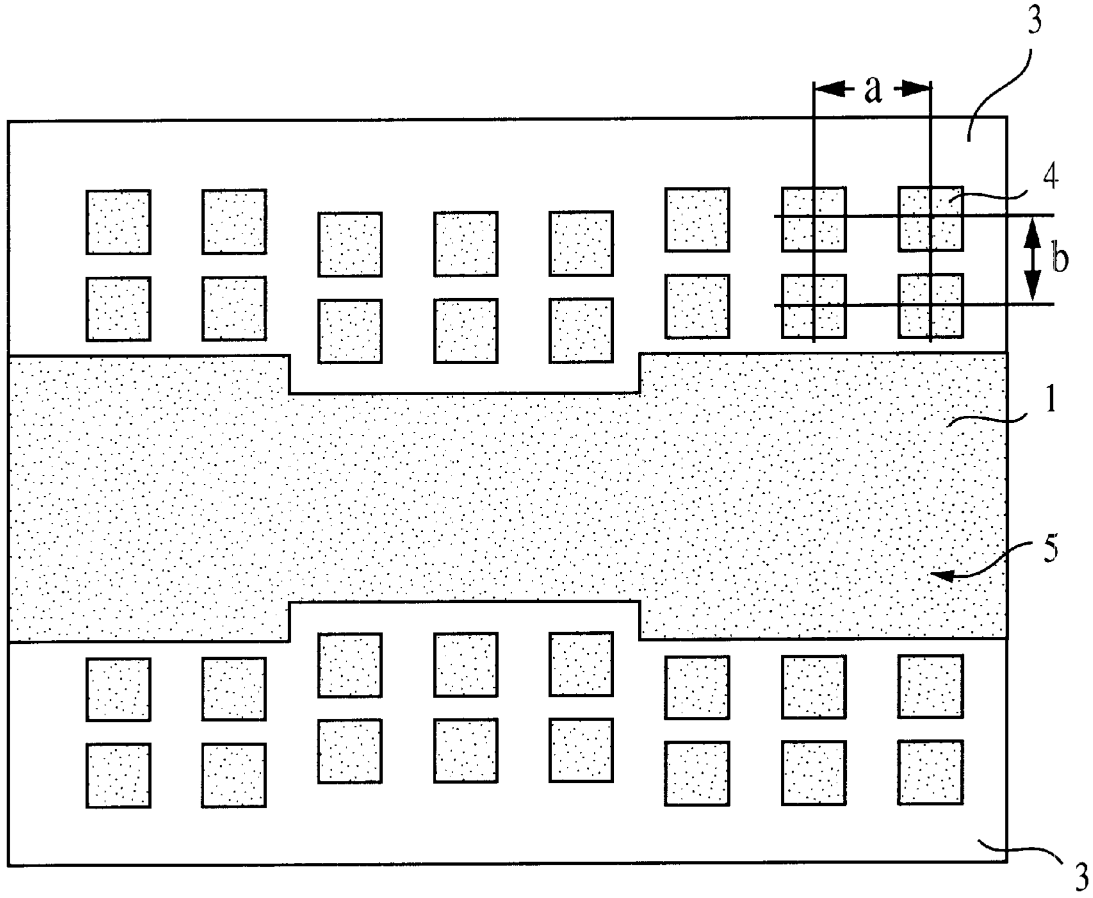
FIG. 6 illustrates the configuration of a transmission line comprising a slot line.

FIG. 6 is an example of a slot line according to the present invention. A slot portion 5 having no ground electrode formed therein is provided on the upper side of a dielectric plate 1. In a ground electrode 3, electrode non-formation portions 4 are distributed at intervals a in the propagation direction and intervals b in the width direction. No ground electrode is formed on the underside of the dielectric plate 1.

Figure 7A:
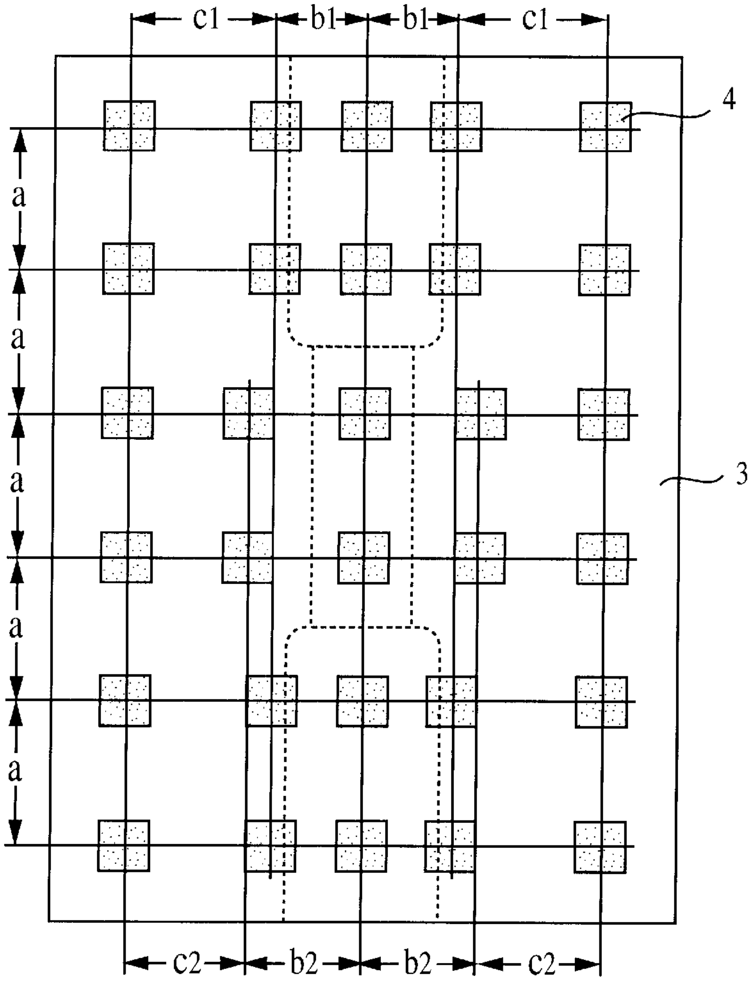
FIGS. 7A and 7B illustrate an example of the configuration of a transmission line comprising a coaxial line.
Figure 7B:
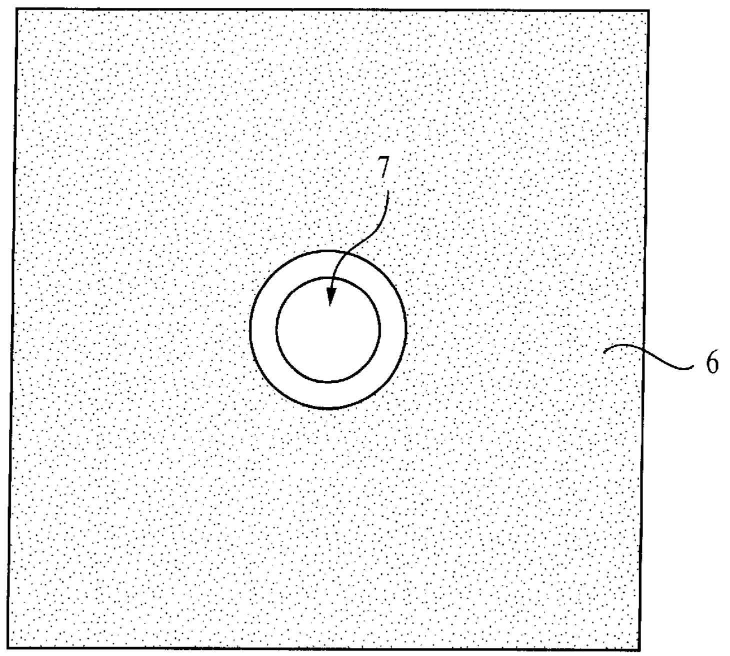

FIGS. 7A and 7B show an example of a transmission line having a coaxial line structure. FIG. 7B is a front view showing the transmission line viewed in the signal propagation direction. FIG. 7A is a plan view of the transmission line. A dielectric block 6 is provided with an inner conductor formation hole 7 formed inside thereof. The front and back faces of the dielectric block are open, and a ground electrode 3 is formed on the other four faces. In the remaining three faces excluding the upper side, electrode non-formation portions 4 are also formed in the same arrangement pattern as shown in FIG. 7A.

The inner conductor formation hole 7 has a step structure in which the inner diameter becomes thin in the center thereof. Accordingly, if the ground electrode 3 is formed wholly on the respective four faces, the line impedance would be increased in the thin portion of the inner conductor formation hole. However, in this embodiment, the intervals b2 in width direction of the electrode non-formation portions 4 positioned correspondingly to the thin portion of inner conductor formation hole is wider than the intervals b1 thereof positioned correspondingly to the thick portion of the inner conductor formation hole, and thereby, the line impedance is kept substantially constant.

Figure 8A:
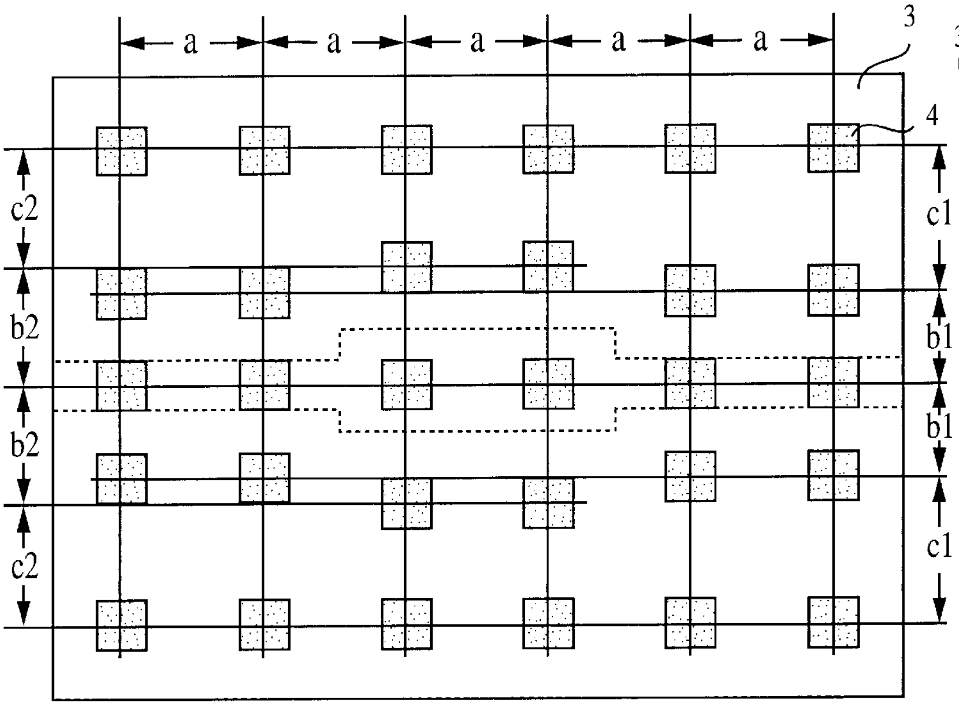
FIGS. 8A, 8B, and 8C illustrate an example of the configuration of a transmission line comprising a strip line.
Figure 8C:
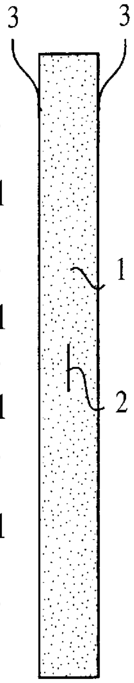
Figure 8B:
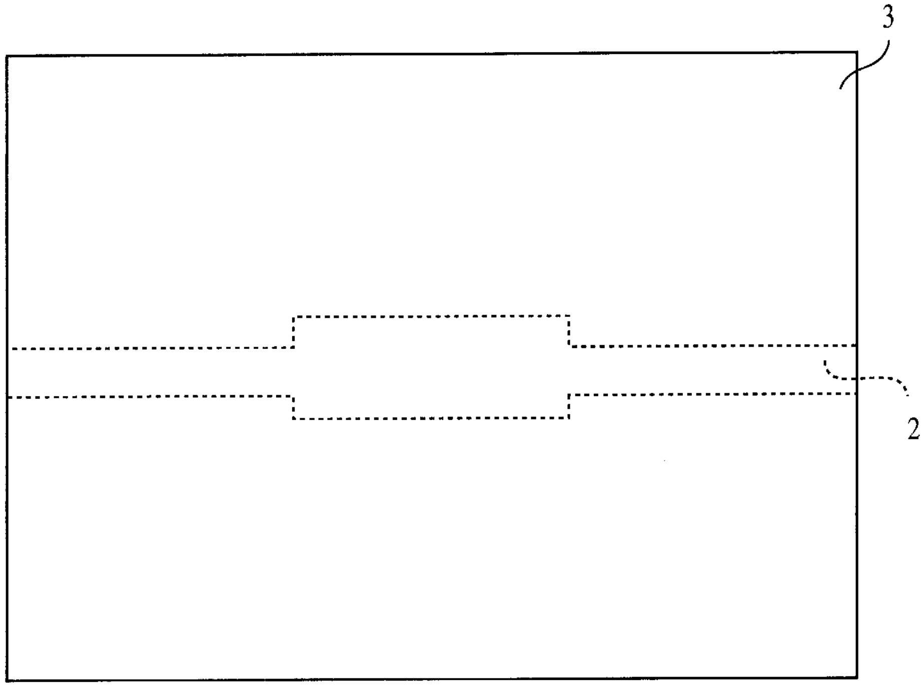

FIGS. 8A and 8B shows an example of a strip line according to the present invention. FIG. 8A is a plan view of the strip line, FIG. 8B is a bottom thereof, and FIG. 8C is a right side view thereof. As shown in the figures, ground electrodes 3 are provided on the upper side and the underside of a dielectric plate 1, and a conductor line 2 is provided in the intermediate layer portion of the dielectric plate 1 to form a strip line. By forming in the ground electrode 3 on the upper side, electrode non-formation portions 4 distributed at predetermined intervals in the propagation direction and in the width direction, a low-pass characteristic is rendered on the higher frequency side of the frequency band of a signal to be propagated. Further, the impedance of the each line portion is determined by changing the intervals in width direction of the electrode non-formation portions 4 correspondingly to the conductor width of a conductor line 2, similarly to the case of FIG. 3.

Figure 9A:
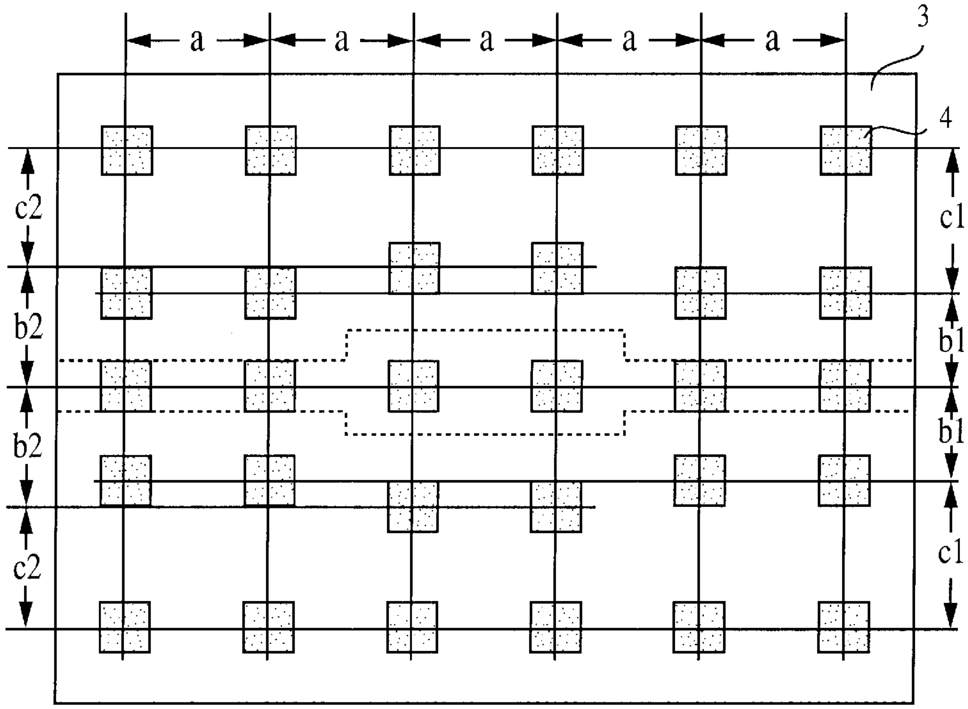
FIGS. 9A, 9B, and 9C illustrate an example of the configuration of a transmission line comprising a strip line.
Figure 9C:
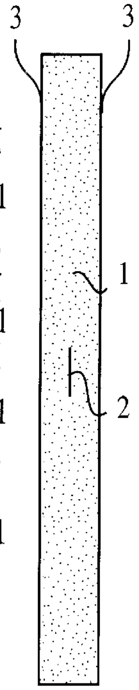
Figure 9B:
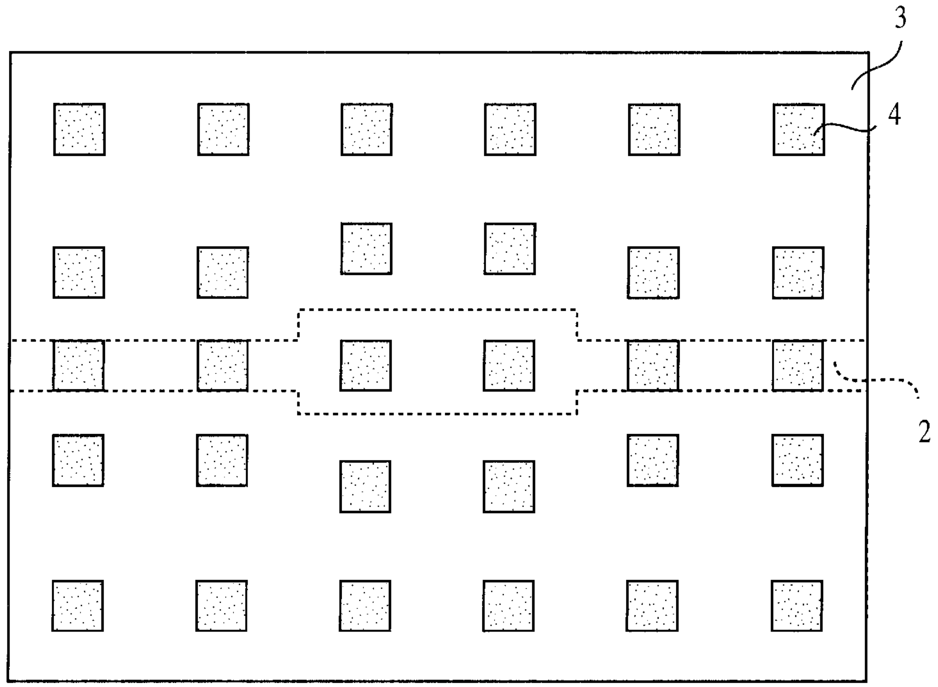

FIGS. 9A and 9B show an example of a strip line. Electrode non-formation portions 4 are distributed on the upper side and the underside of the dielectric plate 1, respectively. Thereby, the band-stop characteristic on the higher frequency side is enhanced.

Hereinafter, examples of filters will be described in which are formed by using the above-described transmission lines as resonance lines.

Figure 10A:
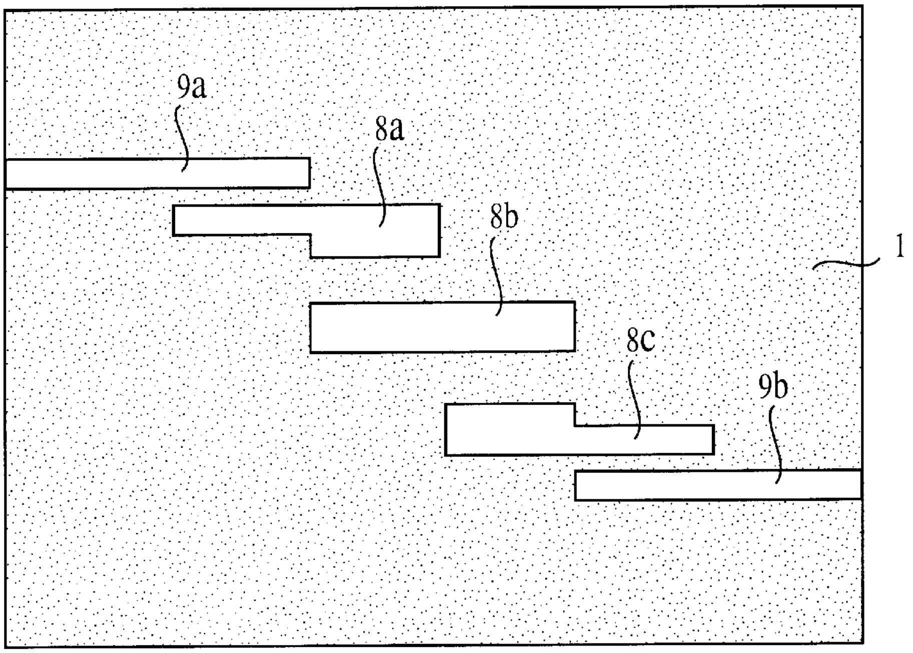
FIGS. 10A and 10B illustrate an example of a filter comprising a microstrip line.
Figure 10B:
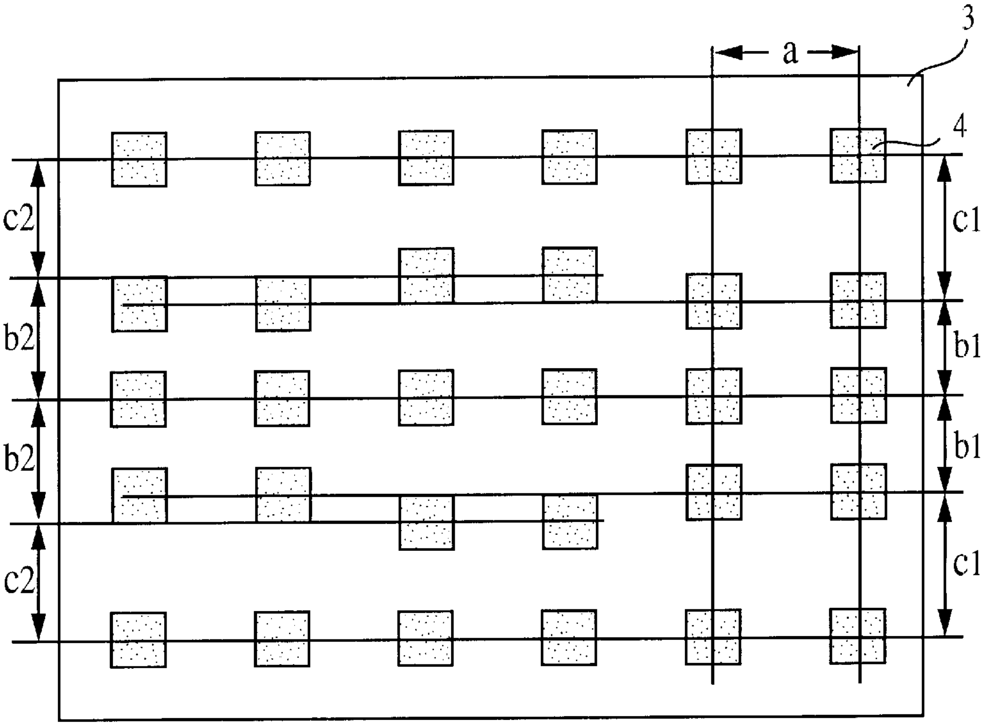

FIGS. 10A and 10B show a filter comprising microstrip lines. Three resonance line conductors **8*a*, 8*b*, and 8*c*, and input-output connection lines 9*a* and 9*b* are formed on the upper side of a dielectric plate 1. A ground electrode 3 is formed on the underside of the dielectric plate 1, and electrode non-formation portions 4** are distributed at predetermined intervals in the propagation direction and in the width direction.

The resonance line conductors **8*a*, 8*b*, and 8*c* act as a half-wave resonator of which the both-ends are open, respectively. The adjacent resonators comprising the resonance line conductors are coupled to each other, and also, the resonance line conductors 8*a* and 8*c* are coupled to the input-output lines 9*a* and 9*b*, respectively. Thus, the filter acts as a band-pass filter comprising three stage resonators. Further, the electrode non-formation portions 4 are provided in the ground electrode 3**, which causes the characteristic that the transmission loss is increased in the band of which the center frequency is determined by the intervals a in the propagation direction and the wavelength on the dielectric plate. Accordingly, the filter has both of the band-pass characteristic having a predetermined center frequency and the band-stop characteristic having a predetermined center frequency. For example, by using the above-described stop-band as a band in which a spurious mode is produced, a filter having excellent spurious characteristics can be easily formed.

The attenuation in the above-described stop-band and the line impedances of the resonance lines are determined by the intervals b1 and b2 in the width direction of the electrode non-formation portions 4.

Figure 11:
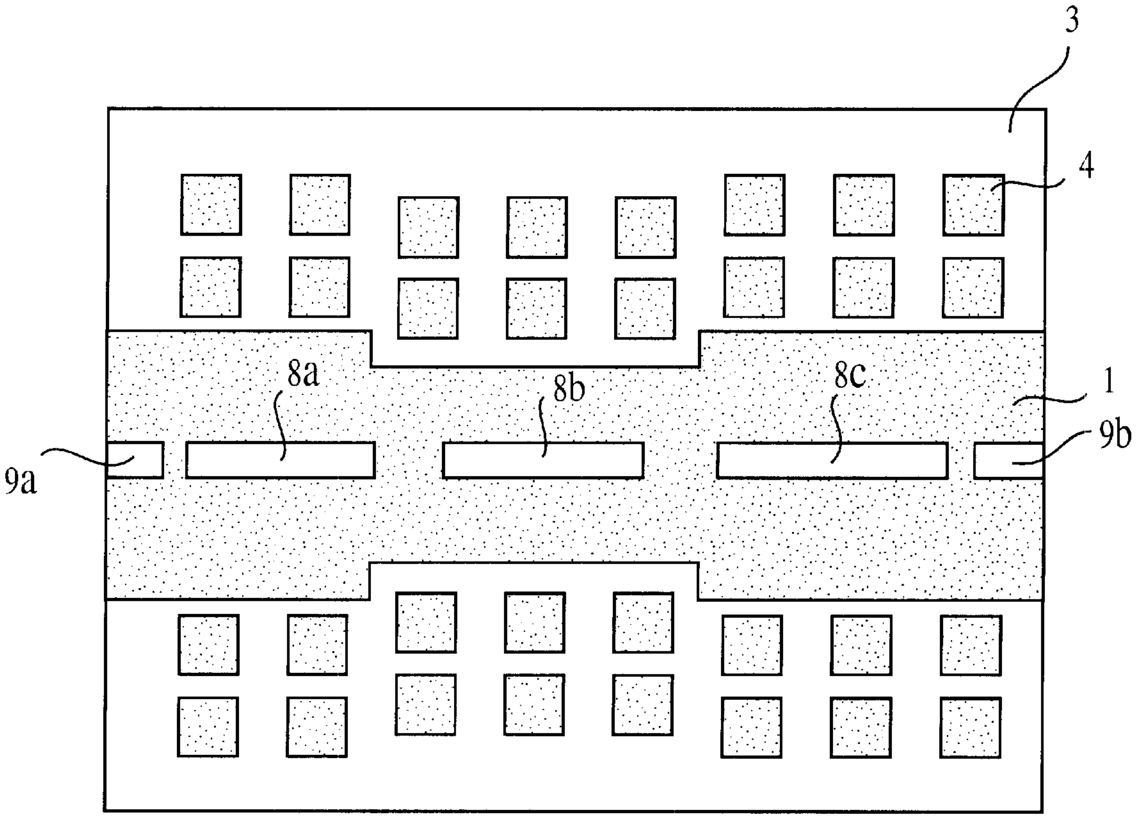
FIG. 11 illustrates an example of a filter comprising a coplanar line.

FIG. 11 shows an example of a filter comprising coplanar lines. Resonance line conductors **8*a*, 8*b*, and 8*c* and input-output connection lines 9*a* and 9*b* are formed on the upper side of a dielectric plate 1. Ground electrodes 3 having electrode non-formation portions 4 distributed therein are provided on the opposite sides of the conductors 8*a*, 8*b*, and 8*c* and the lines 9*a* and 9*b*. If no ground electrode is formed on-the underside of the dielectric plate 1, the resonance line conductors 8*a*, 8*b*, and 8*c* act as resonators each comprising ordinary coplanar lines, respectively. If a ground electrode is formed, the resonance line conductors 8*a*, 8*b*, and 8*c* act as resonators comprising grounded coplanar lines, respectively. Regarding these resonators, adjacent resonators are coupled to each other, and the input-output connection lines 9*a* and 9*b* are coupled to the resonance line conductors 8*a* and 8*c*, respectively. With this configuration, the filter acts as a band-pass filter comprising three stage resonators. Further, the electrode non-formation portions 4 are formed in the ground electrode 3**, which causes the characteristic that the transmission loss is increased in a predetermined frequency band. Thus, the filter has both of the band-pass characteristic having a predetermined center frequency and the band-stop characteristic having a predetermined center frequency.

Figure 12A:
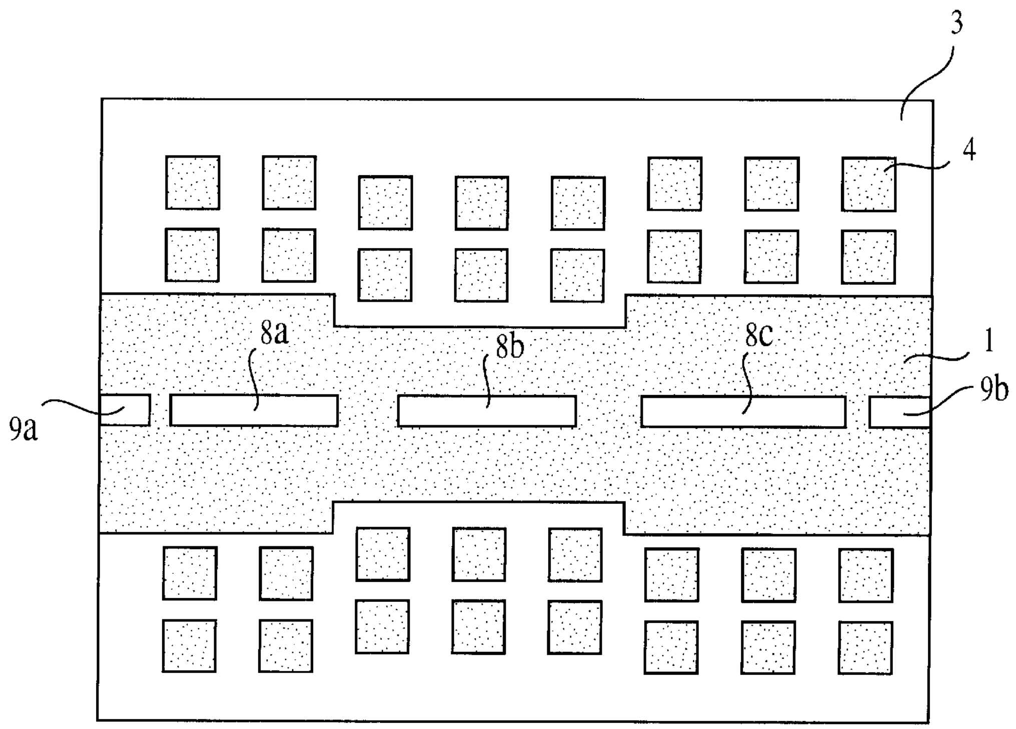
FIGS. 12A and 12B illustrate an example of the configuration of a filter comprising a grounded coplanar line.
Figure 12B:
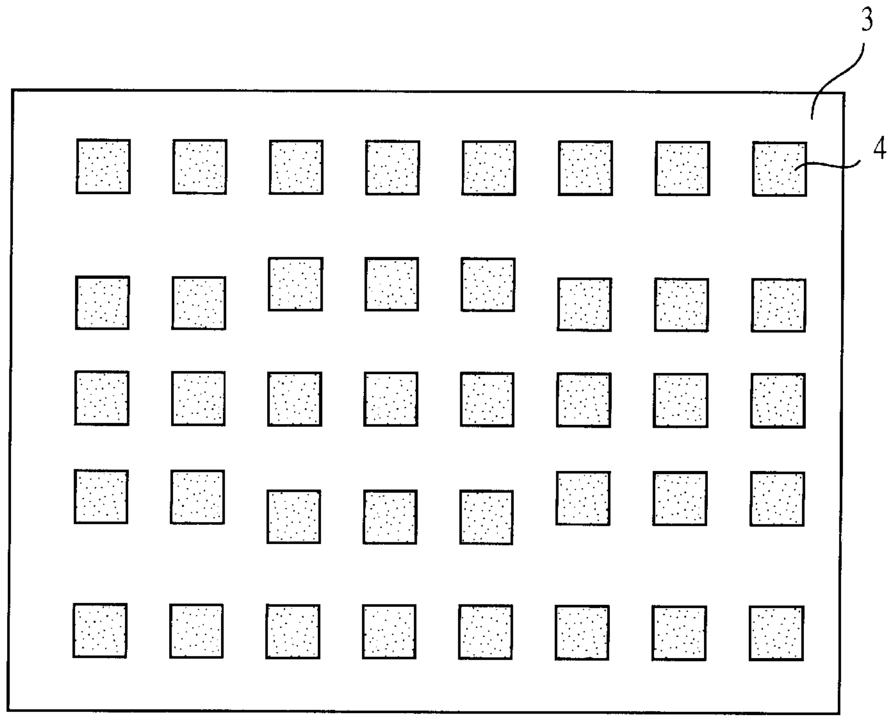

FIGS. 12A and 12B show an example of a filter of which the resonance lines comprise coplanar lines, respectively. Electrode non-formation portions 4 are provided so as to be distributed in a ground electrode 3 on the underside of a dielectric plate 1 at predetermined intervals in the propagation direction and in the width direction. Thereby, the attenuation in the stop-band, produced by the electrode non-formation portions, can be increased.

Figure 13A:
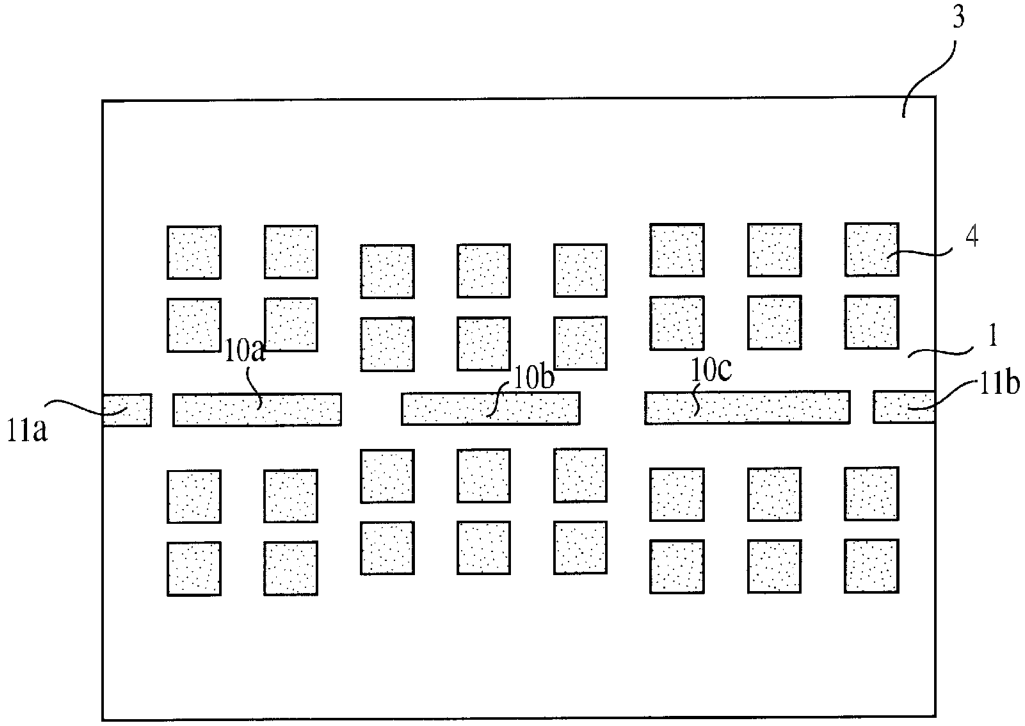
FIGS. 13A and 13B illustrate an example of a filter comprising a slot line.
Figure 13B:
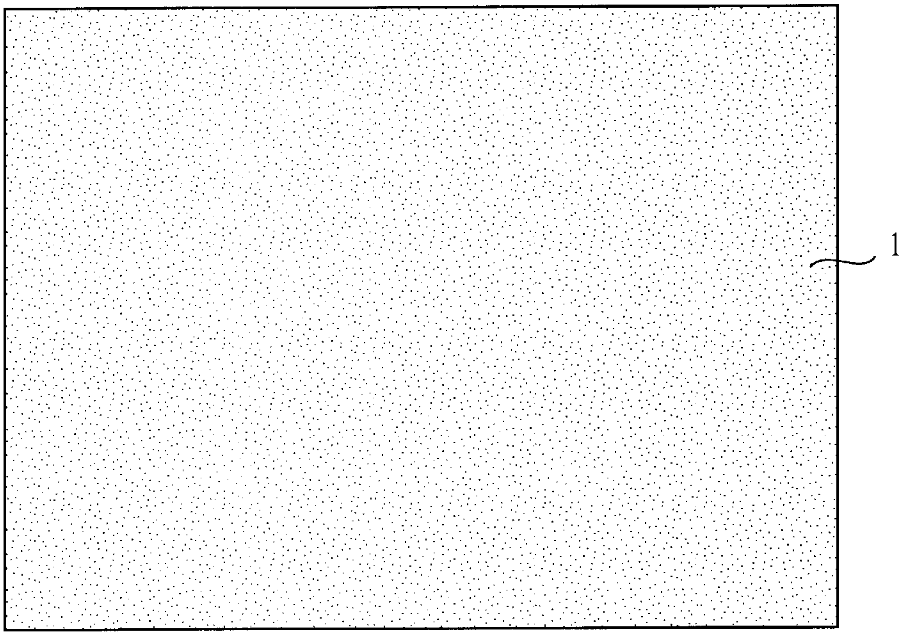

FIGS. 13A and 13B are the example in which the resonance lines comprise slot lines, respectively. On the upper side of a dielectric plate 1, a ground electrode 3 is formed, and moreover, resonance slot portions 10*a*, 10*b*, and 10*c*, input-output connection slot portions 11*a* and 11*b*, and electrode non-formation portions 4 are provided. Accordingly, the filter has both of the band-pass characteristic caused by the three stage resonators comprising the slot lines, and the band-stop or low-pass characteristic caused by the electrode non-formation portions 4.

Figure 14:
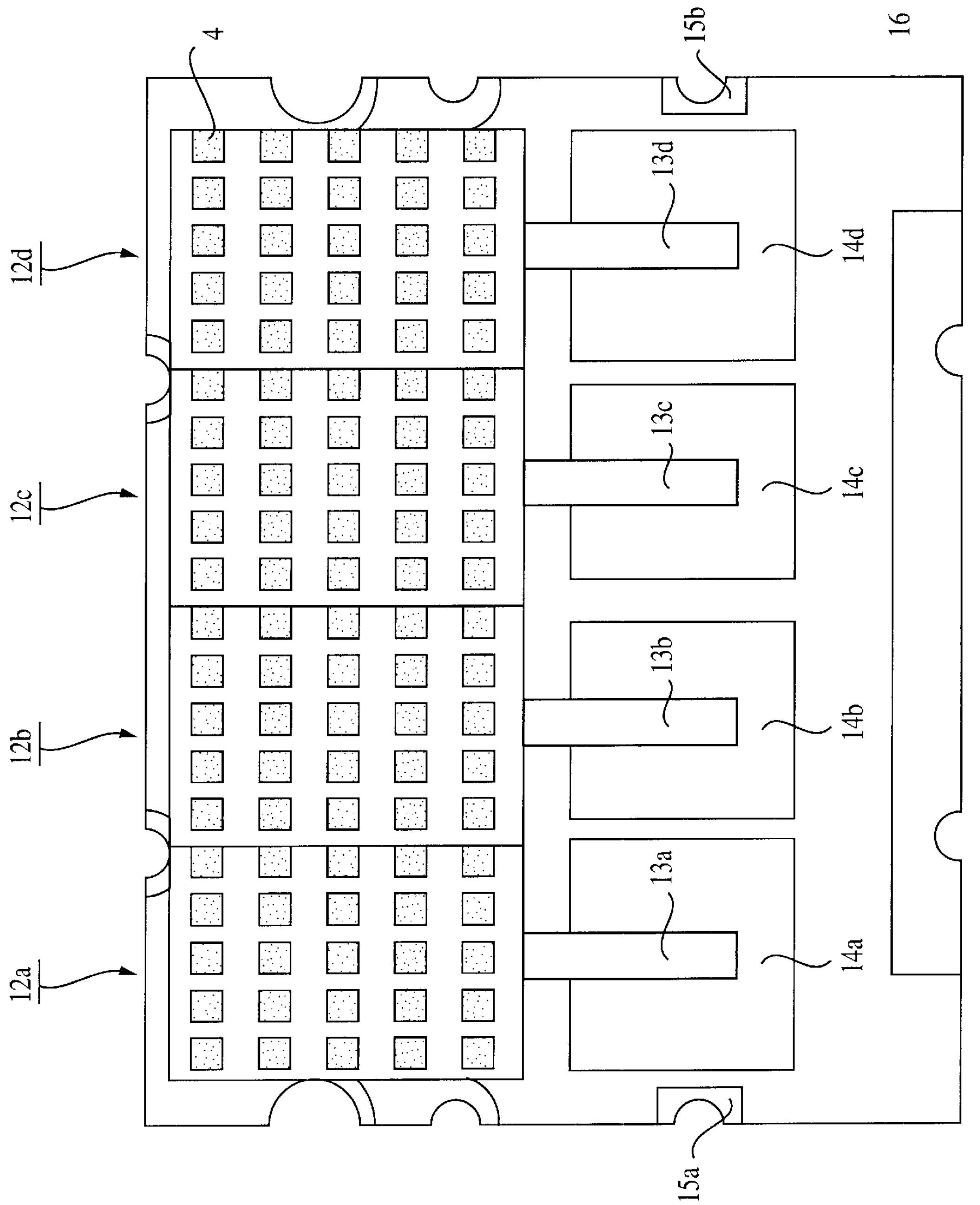
FIG. 14 illustrates an example of the configuration of a filter comprising coaxial resonators.

FIG. 14 shows the example in which coaxial resonators are provided. Axial resonators 12*a*, 12*b*, 12*c*, and 12*d* are mounted onto a substrate 16. Each of the coaxial resonators 12*a* to 12*d* is produced by forming an inner conductor formation hole inside of a prism-shaped dielectric block, and forming on the outer surface of the dielectric block a ground electrode and moreover electrode non-formation portions 4. Into the inner conductor formation holes of the coaxial resonators, inner conductor lead terminals 13*a*, 13*b*, 13*c*, and 13*d* are inserted, and the ends thereof are soldered to connection electrodes 14*a*, 14*b*, 14*c*, and 14*d* on the substrate, respectively. Regarding these connection electrodes 14*a* to 14*d*, a static capacitance between adjacent connection electrodes is produced, so that the electrodes are capacitance-coupled. Further, static capacitances are produced between input-output electrodes 15*a*, 15*b* and connection electrodes 14*a*, 14*d* for external coupling.

Thus, obtained is a filter comprising four resonators which resonate at predetermined frequencies and attenuate in other predetermined frequency bands, respectively, and having band-pass and band-stop characteristics.

FIGS. 15A and 15B show an example of a filter comprising strip lines. Ground electrodes 3 are formed on the upper side and the underside of a dielectric plate 1. Resonance line conductors 8*a*, 8*b*, and 8*c* and input-output connection lines 9*a* and 9*b* are formed inside of the dielectric plate 1. Electrode non-formation portions 4 are distributed in the ground electrode 3 on the upper side.

Figure 16A:
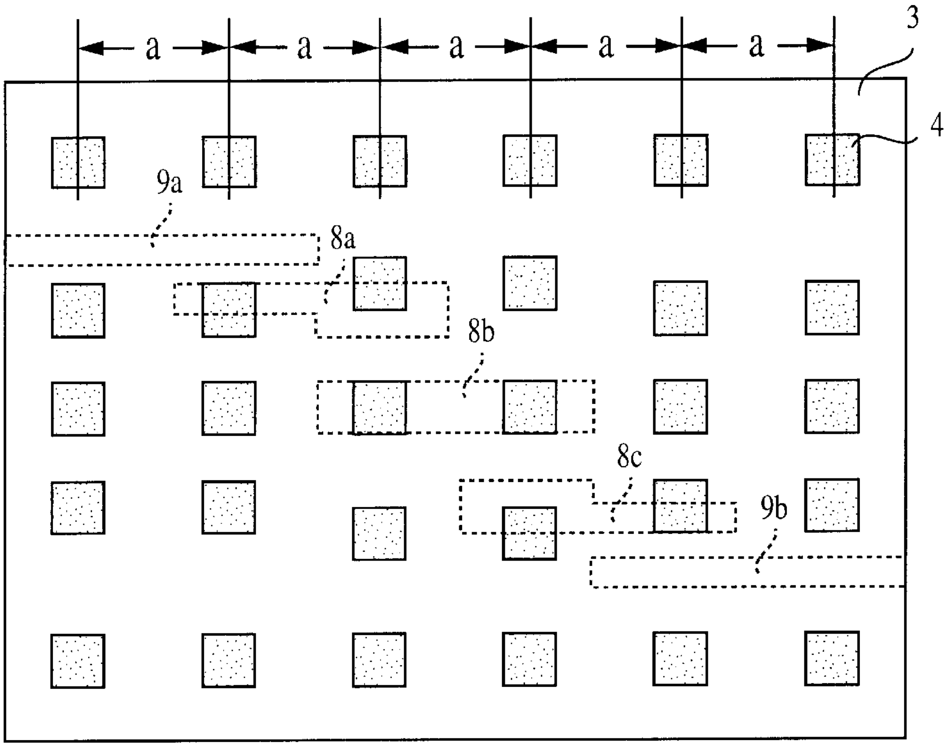
FIGS. 16A, 16B and 16C illustrate an example of the configuration of a filter comprising another strip line.
Figure 16C:
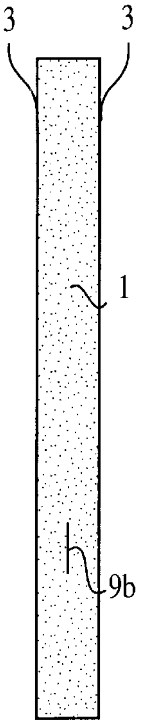
Figure 16B:
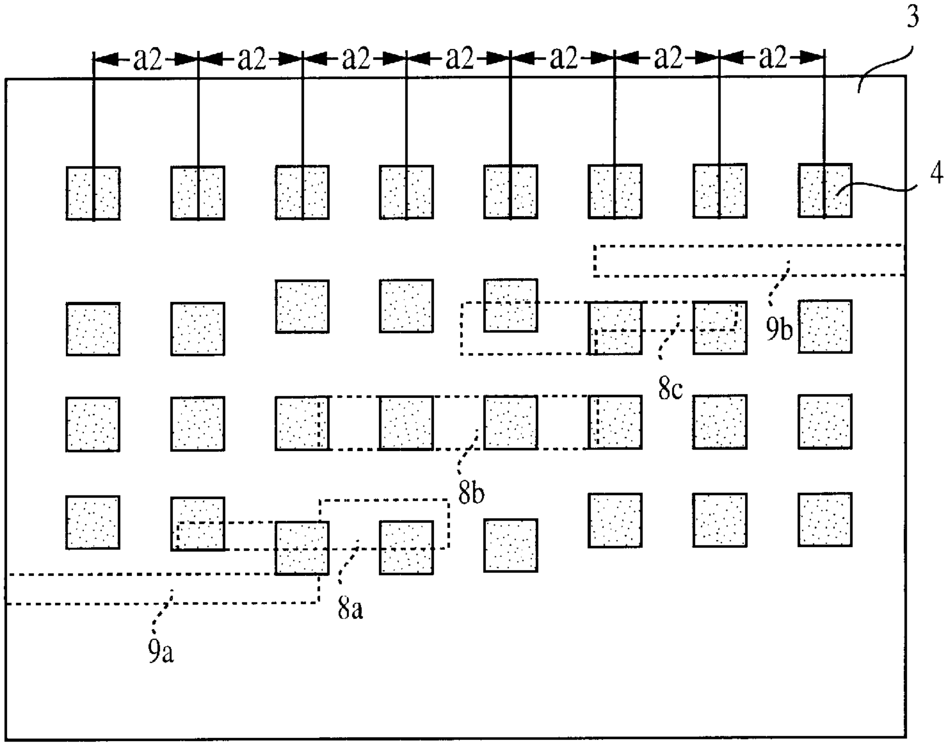

FIGS. 16A and 16B show an example of a filter comprising strip lines. Electrode non-formation portions 4 are also distributed on the underside of a dielectric plate 1. It should be noted that the pattern of the electrode non-formation portions 4 on the upper side is different from that of the electrode non-formation portions 4 on the underside. Thereby, the stop-band determined by the intervals al in the propagation direction of the electrode non-formation portions on the upper side is different from that determined by the intervals a2 of the electrode non-formation portions on the underside. For example, by setting these two stop-bands in bands where spurious components to be suppressed are produced, many spurious components can be effectively eliminated. In addition, by arranging the two stop-bands to be continuous, an attenuation characteristic can be rendered over a relatively wide band.

Figure 17:
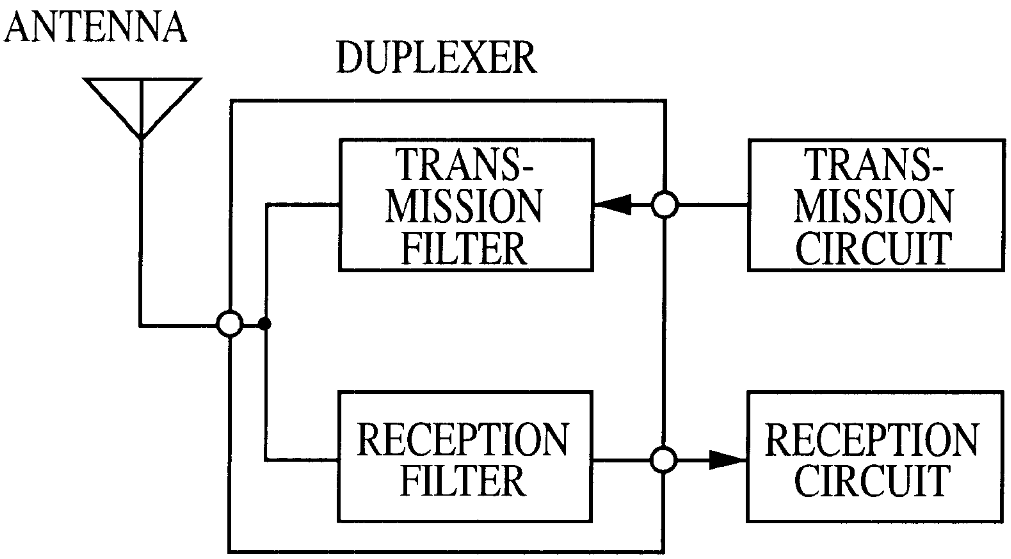
FIG. 17 illustrates the configurations of a duplexer and a communication device.

Next, examples of the configurations of a duplexer and a communication device will be described in reference to FIG. 17.

Hereupon, a reception filter and a transmission filter have a band-pass and a band-stop characteristic, respectively, and have one of the above-described configurations. The pass-band and the stop-band of the transmission filter are made to coincide with a transmission signal band and a reception signal band, respectively. The pass-band and the stop-band of the reception filter are made to coincide with a reception signal band and a transmission signal band, respectively. To a duplexer configured as described above, a reception circuit and a transmission circuit, and an antenna are connected to constitute a communication device.

According to the present invention, the impedance of the line and the attenuation in the stop-band can be determined, independently of the center frequency of the stop-band. Accordingly, a transmission line having a desired transmission characteristic can be formed.

Further, a step structure by which the impedance matching is carried out on the way of the transmission line, and the impedance is changed on the way of the transmission line can be easily adopted.

Moreover, since the filter having a band-stop characteristic or a low-pass characteristic, caused by the characteristics of the transmission line itself can be used, the whole configuration of the filter can be much simplified.

To the filter, both of the frequency characteristic caused by the electrode non-formation portions and the frequency characteristic caused by the resonance lines can be rendered. Accordingly, a filter having a high function, though it is small in size, can be provided.

According to the present invention, a duplexer for an antenna sharing device and so forth, which is small in size and has a high function, can be provided.

Furthermore, according to the present invention, a miniaturized communication device can be provided.

While the invention has been particularly shown and described with reference to preferred embodiments thereof, it will be understood by those skilled in the art that the foregoing and other changes in form and details may be made therein without departing from the spirit of the invention.

What is claimed is:

1. A transmission line comprising:

a substrate;

a signal propagation line portion disposed on a main surface of the substrate; and a ground electrode disposed on another surface of the substrate in correspondence to the signal propagation line portion, the ground electrode defining a ground electrode formation surface;

wherein electrode non-formation portions are formed on the ground electrode formation surface so as to be distributed at substantially equal intervals in a signal propagation direction and at substantially equal intervals in the direction perpendicular to the signal propagation direction, the intervals in the perpendicular direction being different from the intervals in the signal propagation direction.

2. The transmission line according to claim 1, wherein the intervals of the electrode non-formation portions substantially in the perpendicular direction to the signal propagation direction are changed in correspondence to the line impedance of the signal propagation line.

3. A filter comprising the transmission line of claim 1, and further comprising a signal input/output connection coupled to said transmission line.

4. A filter comprising a plurality of the transmission lines of claim 1, wherein adjacent ones of said plurality of transmission lines are coupled to each other.

5. A communication device including the transmission line of claim 1, and further comprising a high-frequency circuit including at least one of a transmission circuit and a reception circuit connected to said transmission line.

6. A transmission line comprising:

a substrate;

a signal propagation line portion disposed on a surface of the substrate; and a ground electrode disposed on the surface of the substrate in correspondence to the signal propagation line portion, the ground electrode defining a ground electrode formation surface;

wherein electrode non-formation portions are formed on the ground electrode formation surface so as to be distributed at substantially equal intervals in a signal propagation direction and at intervals in the direction perpendicular to the signal propagation direction, at least one of the intervals in the perpendicular direction being different from the intervals in the signal propagation direction.

7. The transmission line according to claim 6, wherein the intervals of the electrode non-formation portions substantially in the perpendicular direction to the signal propagation direction are changed in correspondence to the line impedance of the signal propagation line.

8. A filter comprising the transmission line of claim 6, and further comprising a signal input/output connection coupled to said transmission line.

9. A filter comprising a plurality of the transmission lines of claim 6, wherein adjacent ones of said plurality of transmission lines are coupled to each other.

10. A communication device including the transmission line of claim 6, and further comprising a high-frequency circuit including at least one of a transmission circuit and a reception circuit connected to said transmission line.

11. A transmission line comprising:

a dielectric block having an inner conductor formation hole;

a signal propagation line portion disposed on the inner conductor formation hole; and a ground electrode disposed on an outer surface of the dielectric block in correspondence to the signal propagation line portion, the ground electrode defining a ground electrode formation surface;

wherein electrode non-formation portions are formed on the ground electrode formation surface so as to be distributed at substantially equal intervals in a signal propagation direction and at intervals in the direction perpendicular to the signal propagation direction, at least one of the intervals in the perpendicular direction being different from the intervals in the signal propagation direction.

12. The transmission line according to claim 11, wherein the intervals of the electrode non-formation portions substantially in the perpendicular direction to the signal propagation direction are changed in correspondence to the line impedance of the signal propagation line.

13. A filter comprising the transmission line of claim 11, and further comprising a signal input/output connection coupled to said transmission line.

14. A filter comprising a plurality of the transmission lines of claim 11, wherein adjacent ones of said plurality of transmission lines are coupled to each other.

15. A communication device including the transmission line of claim 11, and further comprising a high-frequency circuit including at least one of a transmission circuit and a reception circuit connected to said transmission line.

16. A transmission line comprising:

a substrate;

a signal propagation line portion disposed on a surface of an intermediate layer portion of the substrate; and a ground electrode disposed on another surface of the substrate in correspondence to the signal propagation line portion, the ground electrode defining a ground electrode formation surface;

wherein electrode non-formation portions are formed in the ground electrode formation surface so as to be distributed at substantially equal intervals in a signal propagation direction and at intervals in the direction perpendicular to the signal propagation direction, at least one of the intervals in the perpendicular direction being different from the intervals in the signal propagation direction;

wherein said signal propagation line portion has an enlarged portion which is wider in said perpendicular direction than other portions of said signal propagation line portion; and wherein said at least one of the intervals in the perpendicular direction is adjacent to said enlarged portion of said signal propagation line portion.

17. The transmission line according to claim 16, wherein the intervals of the electrode non-formation portions substantially in the perpendicular direction to the signal propagation direction are changed in correspondence to the line impedance of the signal propagation line.

18. A filter comprising the transmission line of claim 16, and further comprising a signal input/output connection coupled to said transmission line.

19. A filter comprising a plurality of the transmission lines of claim 16, wherein adjacent ones of said plurality of transmission lines are coupled to each other.

20. A communication device including the transmission line of claim 16, and further comprising a high-frequency circuit including at least one of a transmission circuit and a reception circuit connected to said transmission line.

* * * * *